(12) United States Patent
Castaldo et al.

(10) Patent No.: US 9,093,232 B2
(45) Date of Patent: Jul. 28, 2015

(54) ELECTRONIC SWITCH FOR LOW-VOLTAGE AND HIGH SWITCHING SPEED APPLICATIONS

(71) Applicant: STMICROELECTRONICS S.R.L., Agrate Brianza (IT)

(72) Inventors: Enrico Castaldo, Catania (IT); Antonino Conte, Tremestieri Etneo (IT); SantiNunzioAntonino Pagano, Catania (IT); Stefania Rinaldi, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/859,195

(22) Filed: Apr. 9, 2013

(65) Prior Publication Data

US 2013/0335121 A1    Dec. 19, 2013

(30) Foreign Application Priority Data

Apr. 19, 2012    (IT) .............................. MI2012A0650

(51) Int. Cl.
| | |
|---|---|
| *H03K 17/16* | (2006.01) |
| *H01H 11/00* | (2006.01) |
| *H03K 17/0412* | (2006.01) |
| *H03K 17/06* | (2006.01) |
| *H03K 19/017* | (2006.01) |

(52) U.S. Cl.
CPC ......... *H01H 11/00* (2013.01); *H03K 17/04123* (2013.01); *H03K 17/063* (2013.01); *H03K 19/01714* (2013.01); *Y10T 29/49105* (2015.01)

(58) Field of Classification Search
CPC ........... H03K 17/063; H03K 19/01714; Y10T 29/49105
USPC .................................................... 327/387, 390
See application file for complete search history.

(56) References Cited

U.S. PATENT DOCUMENTS

| | | |
|---|---|---|
| 5,594,380 A | 1/1997 | Nam |
| 5,894,241 A | 4/1999 | Rees |
| 6,215,348 B1 * | 4/2001 | Steensgaard-Madsen .... 327/390 |
| 2007/0046359 A1 * | 3/2007 | Zanchi et al. ................. 327/390 |

FOREIGN PATENT DOCUMENTS

DE            10235447 A1    2/2004

* cited by examiner

*Primary Examiner* — Lincoln Donovan
*Assistant Examiner* — Colleen O Toole
(74) *Attorney, Agent, or Firm* — Allen, Dyer, Doppelt, Milbrath & Gilchrist, P.A.

(57) ABSTRACT

An electronic switch may include transfer transistor having a first conduction terminal for receiving an input signal, a second conduction terminal, and a control terminal. The transfer transistor may enable/disable a transfer of the input signal from the first conduction terminal to the second conduction terminal according to a control signal. The control signal may take a first value and a second value different from the first value, a difference between the first value and the second value defining, in absolute value, an operative value of the control signal. The electronic switch may further comprise a driving circuit for receiving the input signal and the control signal, and for providing a driving signal equal to the sum between the input signal and the operative value of the control signal to the control terminal of the transfer transistor.

20 Claims, 5 Drawing Sheets

ELECTRONIC SWITCH FOR LOW-VOLTAGE AND HIGH SWITCHING SPEED APPLICATIONS

FIELD OF THE DISCLOSURE

The present disclosure relates to the electronics field, and more specifically, to electronic switches for low-voltage applications.

BACKGROUND

Electronic switches or switches are used in many electronic applications (for example, in analog and/or digital electronic circuits) for controlling (e.g. enabling or disabling) the transfer of electric signals across them according to specific functionalities to be carried out. The switch comprises, in its simplest implementation, a transistor (for example, of the MOSFET type) in "pass transistor" configuration. In such a configuration, the transfer of electric signals between a first conduction terminal (for example, the drain terminal) and a second conduction terminal (for example, the source terminal) is enabled/disabled by the turning on/off of the transistor. This is typically achieved by driving a control terminal of the transistor (e.g., the gate terminal) with a proper control signal (usually, a signal configured for taking a low level—for example, equal to a ground voltage—or a high level—for example, equal to a supply voltage). Such configuration is not always satisfactory since electric signals with values close to the supply, or ground, voltage are not completely transferred where the switch comprises an N-channel MOSFET transistor (nMOS), or a P-channel MOSFET transistor (pMOS), respectively.

In another implementation, the switch comprises an nMOS transistor and a pMOS transistor in "transmission gate" configuration. In such a configuration, the drain/source terminals of the nMOS transistor are connected to the source/drain terminals of the pMOS transistor (parallel connection), and the gate terminals are driven by complementary levels of the control signal. In this way, the closing of the switch occurs by turning-on both transistors, which enables the complete transfer of the electric signals having values close to the supply/ground voltage across the pMOS/nMOS transistor. The opening of the switch occurs by turning-off both transistors, which disables the transfer of any electrical signal across them.

Although widely used, such an approach may have some drawbacks that preclude wider use thereof, for example, in applications with stringent requirements in terms of electric power consumption, heat dissipation, area occupation, and/or performance. An example of such applications is in analog and/or digital microelectronic circuits (e.g. comprising operational amplifiers), which are integrated in very small areas and are affected by particularly low maximum voltages and currents (e.g. supply voltage of the order of 1-1.3 V).

In such circuits, the use of switches implemented by transistors in "transmission gate" configuration, other than having a high area occupation, also has issues in terms of operation. In fact, the reduction of the supply voltage (and hence the high level of the control signal) results, for the same technology (and hence for the same threshold voltage of the transistors), in decreasing the overdrive voltage (difference between the voltage drop between the gate and source terminals and the threshold voltage) such as not to be sufficient to ensure the correct turning-on of the transistors in any operating condition. For example, in case of a half-swing electric signal, i.e. having an intermediate value between the supply voltage and the ground voltage, the overdrive voltage of the pMOS transistor might be zero (or lower than zero), thereby preventing the turning-on thereof. The overdrive voltage of the nMOS transistor might go to zero before the complete transfer of the electric signal.

An approach to such issues may comprise implementing each switch with a single (typically nMOS) transistor in "pass transistor" configuration, being driven by a control signal whose high level has a value greater than the supply voltage (or overvoltage). Hence, it is able to withstand high voltage drops between the gate terminal and the drain terminal—thus referred to as a high-voltage transistor hereinafter (for distinguishing it from the previous ones, or low-voltage transistors).

Such an approach, although allowing the proper transfer of full-swing electric signals, may not be satisfactory in terms of area occupation, as the high-voltage transistors are larger than the low-voltage transistors, and performance, as the high-voltage transistors, having large size, introduce considerable parasitic capacitances, which limit the switching frequency of the switches. Furthermore, such an approach may require the use of circuit elements (e.g. charge pumps) able to generate the overvoltages, which increases area occupation and electric power consumption.

SUMMARY

An approach according to the present embodiments may be based on driving the control terminal with a driving signal equal to the combination between the control signal and the electric signal to be transferred.

An electronic switch may include a transfer transistor having a first conduction terminal configured to receive an input signal, a second conduction terminal, and a control terminal. The transfer transistor may be configured to enable/disable a transfer of the input signal from the first conduction terminal to the second conduction terminal according to a control signal. The control signal may take a first value and a second value different from the first value, a difference between the first value and the second value defining, in absolute value, an operative value of the control signal. The electronic switch may include a driving circuit configured to receive the input signal and the control signal, and provide a driving signal equal to a sum between the input signal and the operative value of the control signal to the control terminal of the transfer transistor.

BRIEF DESCRIPTION OF THE DRAWINGS

The approach according to one or more embodiments, as well as further features and advantages thereof, will be best understood with reference to the following detailed description, given purely by way of non-limiting example, to be read jointly with the accompanying drawings (wherein corresponding elements are indicated by same or similar references and their explanation is not repeated for the sake of brevity). In particular.

DETAILED DESCRIPTION

More specifically, an aspect is directed to an electronic switch. The electronic switch comprises a transfer transistor having a first conduction terminal for receiving an input signal, a second conduction terminal, and a control terminal. The transfer transistor is configured for enabling/disabling a transfer of the input signal from the first conduction terminal to the second conduction terminal according to a control signal. The control signal is configured for taking a first value and a second value different from the first value, a difference between the first value and the second value defining, in absolute value, an operative value of the control signal. In present embodiments, the electronic switch further comprises a driving circuit configured for receiving the input signal and the control signal, and for providing a driving signal equal to the sum between the input signal and the operative value of the control signal to the control terminal of the transfer transistor. Another aspect is directed to a complex electronic system comprising a substrate, and one or more of such electronic switches on the substrate, and yet another is directed to a corresponding method.

Figure 1:
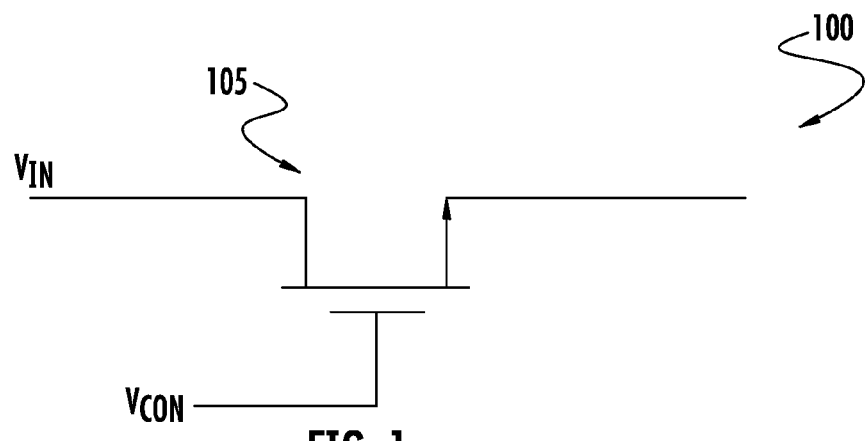
FIG. 1 is a schematic diagram of a switch, according to the prior art.

With reference to FIG. 1, a typical switch 100 is shown. The switch 100 comprises a transfer transistor, or transistor, 105 (for example, of the N-channel MOS type) in "pass transistor" configuration, which is generally configured for enabling or disabling a transfer of electric signals across its terminals.

The transistor 105 comprises a first conduction terminal (e.g. the drain terminal) for receiving an electric signal (for example, an input voltage signal) VIN, a second conduction terminal (e.g. the source terminal), and a control terminal (e.g. the gate terminal) for receiving a control (e.g. voltage) signal VCON to enable or disable, according to a value of such signal, the transfer of the input signal VIN from the drain terminal to the source terminal. In this regard, the control signal VCON is typically configured (as herein assumed by way of example) for taking a low level—for example, equal to a ground voltage (such as 0V)—or a high level—for example, equal to a supply voltage VDD with respect to the ground voltage. Whereas, the input signal VIN is generally between the supply voltage VDD and the ground voltage.

This approach may have some drawbacks in the partial transfer of electric signals. In particular, the input signal VIN having value close to the supply voltage VDD is transferred to the source terminal, but the threshold voltage of the transistor 105 and similarly for an input signal VIN may have values close to the ground voltage in case of implementation of the switch by means of a P-channel MOS transistor.

Some approaches designed to reduce such drawbacks (such as those based on "transmission gate" and on high-voltage transistors) are not suitable for use in applications that have to meet requirements in terms of electric power consumption, heat dissipation, area occupation and/or performance. Such applications, which the present embodiments are directed to, although not exclusively, comprise, for example, analog and/or digital microelectronic circuits comprising devices (such as operational amplifiers) integrated in very small areas and designed to operate with particularly low maximum voltages and currents (e.g. supply voltage VDD of the order of 1-1.3 V).

Figure 2:
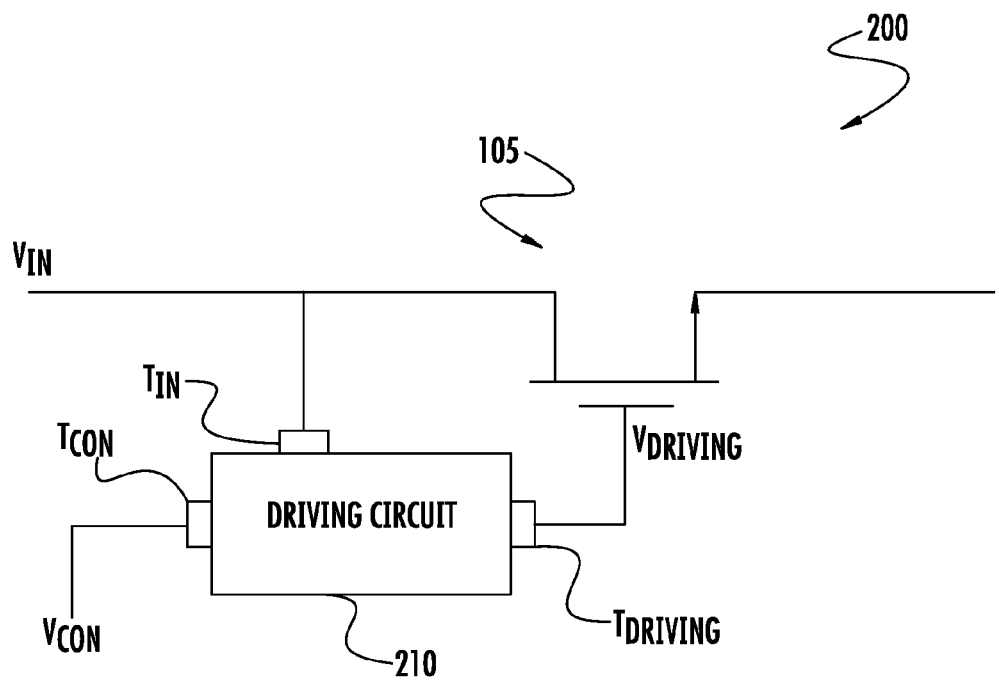
FIG. 2 is a schematic diagram of a switch, according to the present invention.

Turning now to FIG. 2, a switch 200 according to the present embodiments is shown. The switch 200 comprises a transistor 105, which receives the input signal VIN to be transferred to the source terminal at the drain terminal (as before), and a driving (e.g., voltage) signal VDRIVING at the gate terminal. In this regard, the switch 200 comprises a driving circuit 210 for providing the driving signal VDRIVING according to the control signal VCON and the input signal VIN. In particular, the driving circuit 210 has a terminal for receiving the input signal VIN (hereinafter, terminal TIN), another terminal for receiving the control signal VCON (hereinafter, terminal TCON), and a further terminal for providing the driving signal VDRIVING (hereinafter, terminal TDRIVING).

According to the present embodiments, the driving signal VDRIVING is equal to the combination between the control signal VCON and the input signal VIN. In some embodiments, the driving signal VDRIVING is equal to the sum between the input signal VIN and an operative value of the control signal VCON (equal to the difference between the levels of the control signal, i.e. between the supply voltage VDD and the ground voltage in the case at issue). In this way, in case of closing of the switch 200 (control signal VCON asserted, for example, at the high level), the driving signal VDRIVING is sufficiently greater than the input signal VIN (by an amount equal to the supply voltage VDD, in the example at issue) to ensure the turn-on of the transistor 105 and prevent advance turn-off thereof. In this way, for any value of the input signal VIN (between the supply voltage VDD and the ground voltage), the latter is correctly and completely transferred across the terminals of the transistor 105.

Moreover, this is obtained without involving excessive voltage drops (e.g. greater than the supply voltage VDD) between the gate terminal and the drain terminal of the transistor 105, whereby the latter, as working in safety conditions, does not need to be implemented by a high-voltage transistor. As will be understood, the principles of the present embodiments apply in an equivalent manner even in the case where the transistor is of the P-channel MOS type (whereby such sum has to be understood in terms of algebraic sum), or if the high and low levels of the control signal VCON are different from the ones herein assumed (e.g. negative—and in this case, the operative value may be negative, or calculated, according to the specific application, as the absolute value of the difference between the two levels).

Figure 3:
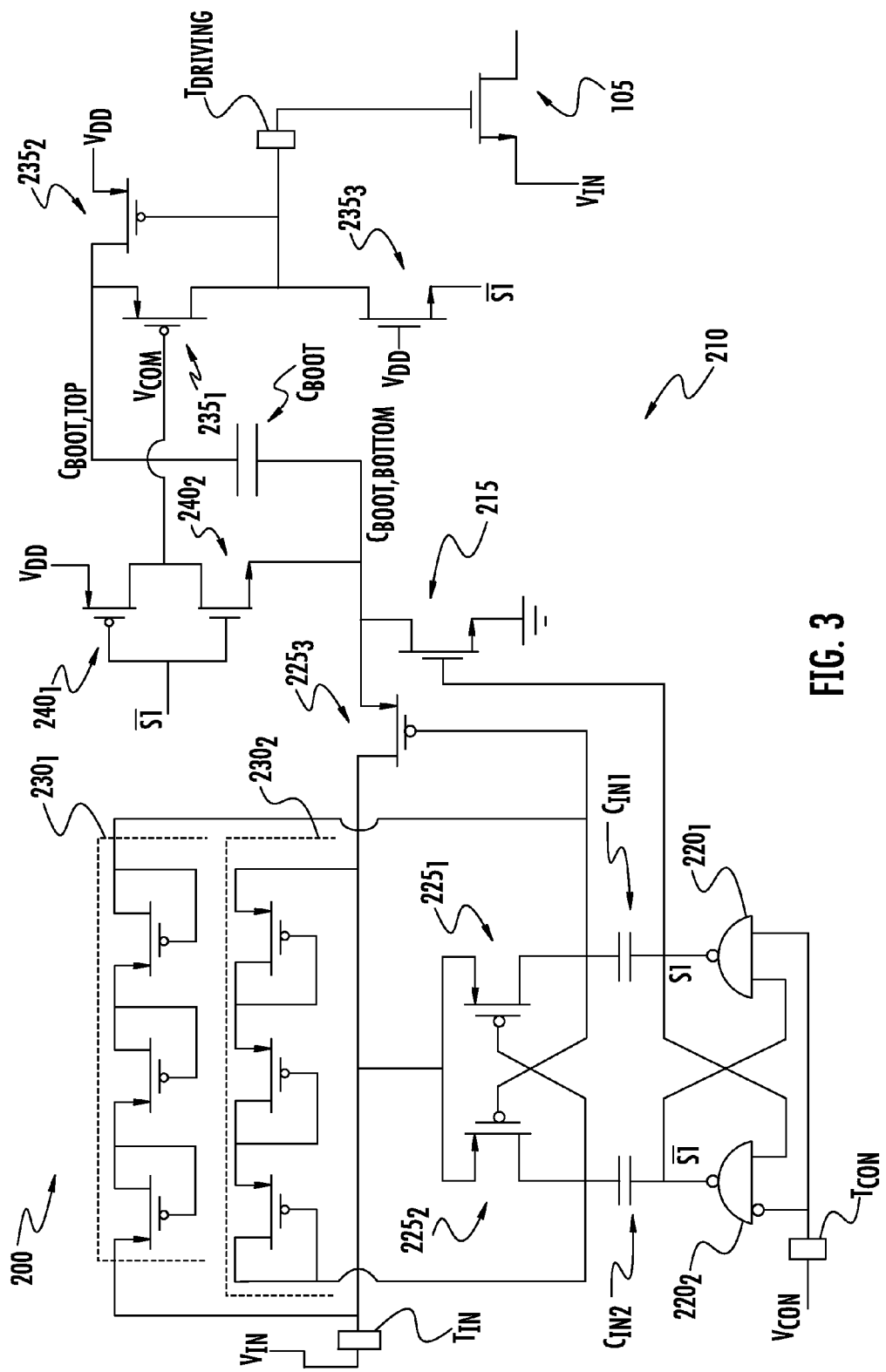
FIG. 3 is a schematic diagram of a circuit implementation of the switch of FIG. 2.

Turning now to FIG. 3, a circuit implementation of the switch 200 (and in particular of the driving circuit 210 thereof) according to an embodiment is now described. The driving circuit 210 comprises a bootstrap capacitor $C_{BOOT}$ for generating the driving signal VDRIVING, and comprises a first plate, or top plate $C_{BOOT, top}$, and a second plate, or bottom plate $C_{BOOT, bottom}$.

The driving circuit 210 further comprises an initialization block configured for initializing the voltage at the bottom plate $C_{BOOT, bottom}$ according to the control signal VCON. In this regard, the initialization block comprises a transistor (for example, of the N-channel MOS type) 215 having the drain terminal connected to the bottom plate $C_{BOOT, bottom}$ and the source terminal connected to the terminal that provides the ground voltage (or ground terminal). Instead, the gate terminal of the transistor 215 receives a logic signal depending on the control signal VCON (or signal S1), in response to which it turns-on, thereby bringing (initializing) the voltage at the bottom plate $C_{BOOT, bottom}$ to the ground voltage, or it turns-off.

The initialization block also comprises two NAND logic gates 2201 and 2202, each one having two input terminals and one output terminal, in semi-latch configuration. In such a configuration, the output terminal of the NAND logic gate 2201, 2202 (which provides the signal S1 and the corresponding negated signal $\overline{S1}$, respectively) is connected to one of the input terminals of the other NAND logic gate 2202, 2201. Whereas, the other input terminal of the NAND logic gate 2201, 2202 receives the control signal VCON (from the terminal TCON) and the corresponding negated control signal (negation operation functionally subtended in the representation of the NAND logic gate 2202). In other words, the NAND logic gates 2201 and 2202 act as a latching element that, upon reception of the control signal VCON and of the corresponding negated control signal, outputs a latched control signal (i.e. the signal S1) and a negated latched control signal (i.e. the signal $\overline{S1}$).

The initialization block further comprises two further capacitors CIN1 and CIN2 generically configured (as it will be explained below) for allowing an optimal transfer of the input signal VIN from the terminal TIN to the bottom plate $C_{BOOT,\ bottom}$. In this regard, the capacitor CIN1, CIN2 has a bottom plate connected to the output terminal of the NAND logic gate 2201,2202 and a top plate coupled to the terminal TIN by a further latching element (as will be explained shortly).

The driving circuit 210 further comprises an input block configured for receiving the input signal VIN from the terminal TIN and correctly transferring it to the bottom plate $C_{BOOT,\ bottom}$, at the end of the corresponding initialization (as will be explained below, in response to that, the bootstrap capacitor $C_{BOOT}$ will generate the driving signal VDRIVING). The input block comprises three transistors (for example, of the P-channel MOS type) 2251, 2252 and 2253. As visible in the figure, the drain terminals of the transistor 2251, 2252 are connected to the gate terminal of the transistor 2252, 2251 at to the top plate of the capacitor CIN1, CIN2, with the respective source terminals that are both connected to the terminal TIN (semi-latch configuration). Instead, the drain, source, and gate terminals of the transistor 2253 are connected to the terminal TIN, to the bottom plate $C_{BOOT,\ bottom}$ and to the drain terminal of the transistor 2251, respectively. In this way, the (voltage) signal at the drain terminal of the transistor 2251 ensures the correct operation of the transistor 2253 that it commands. In fact, the transistors 2251 and 2252 implement a further latching element that, upon reception of the input signal VIN, provides a corresponding shifted latched input signal to the gate terminal of the transistor 2253. As will be explained in the following, such shifted latched input signal is equal, in the exemplary embodiment, to the difference between the input signal VIN and the operative value of the control signal (so as to ensure the correct turn-on of the transistor 2253 and prevent advance turn-off thereof).

In the illustrated embodiment, although not necessarily, the drain terminal of the transistor 2251, 2252 is coupled to the terminal TIN by a respective protection network 2301, 2302 of a typical type (for example, each one comprising three diodes in series), which is adapted to protect the transistors 2251, 2252 from dangerous overvoltages (as will be understood, further technical devices, non-limiting for the present embodiments, may be implemented according to design specifications). In the exemplary illustrated embodiment, each protection network 2301, 2302 comprises a plurality (e.g. three, as shown in the figure) of transistors (e.g. of the P-channel MOS type) in diode-connected configuration (i.e. each one with the respective gate and drain terminals that are short-circuited so as to implement a diode) connected in series with each other. In this way, the voltage drop between the drain terminal and the source terminal of the transistor 2251, 2252 is limited to a value not exceeding three threshold voltages of the single diode—hence of the order of the supply voltage VDD.

The driving circuit 210 further comprises an output block for providing the driving signal VDRIVING to the terminal TDRIVING (and hence to the gate terminal of the transistor 105). The output block comprises two transistors (for example, both of the P-channel MOS type) 2351 and 2352. As shown in the figure, the transistor 2351 has its source terminal connected to the top plate $C_{BOOT,\ top}$, the drain terminal connected to the terminal TDRIVING, and the gate terminal that receives a command (e.g., voltage) signal VCOM. Whereas, the transistor 2352 has its source terminal connected to the supply terminal, the gate terminal connected to the terminal TDRIVING, and the drain terminal connected to the source terminal of the transistor 2351 (and hence to the top plate $C_{BOOT,\ top}$. The output block is further configured for cooperating, in an initialization phase (de-assertion of the control signal VCON), with the initialization block to provide the operative value of the control signal VCON between the top plate $C_{BOOT,\ top}$ and the bottom plate $C_{BOOT,\ bottom}$ of the bootstrap capacitor $C_{BOOT}$.

In some embodiments (as shown in the figure), although not necessarily, the output block comprises a further transistor 2353 (for example, of the N-channel MOS type) generally configured to speed-up the transfer of the driving signal VDRIVING from the top plate $C_{BOOT,\ top}$ to the terminal TDRIVING across the transistor 2351. In this regard, the transistor 2353 has the drain terminal connected to the terminal TDRIVING, the gate terminal connected to the supply terminal, and the source terminal connected to the output terminal of the NAND logic gate 2202 (connection not shown) for receiving the signal $\overline{S1}$.

The driving circuit 210 also comprises a command block for commanding the output block by way of the command signal VCOM. The command block comprises a transistor (for example, of the P-channel MOS type) 2401 having the source terminal connected to the supply terminal, the gate terminal connected to the output terminal of the NAND logic gate 2202 (connection not shown) for receiving the signal $\overline{S1}$, and the drain terminal connected to the gate terminal of the transistor 2351, and another transistor (for example, of the N-channel. MOS type) 2402 having the drain and gate terminals connected to the drain and gate terminals, respectively, of the transistor 2401, and the source terminal connected to the bottom plate $C_{BOOT,\ bottom}$. Therefore, the transistors 2401 and 2402 act, on the whole, as an inverter (having a reference terminal that receives the supply voltage VDD and another reference terminal coupled to the bottom plate $C_{BOOT,\ bottom}$) configured for receiving the signal $\overline{S1}$ and providing the command signal VCOM. As will be clarified in the following, when the signal $\overline{S1}$ is asserted, the command signal VCOM is equal to a current valve to the bottom plate $C_{BOOT,\ bottom}$.

FIG. 4 schematically shows behavior over time of some exemplary signals of the switch 200 obtained by circuit simulation. In particular, such figure shows timing diagrams of the signals VCON, VCOM, S1, $\overline{S1}$ and VIN, and of the voltage levels at the bottom plate $C_{BOOT,\ bottom}$, at the top plate $C_{BOOT,\ top}$ and at the terminal TDRIVING (indicated in the figure $V_{CBOOT,\ bottom}$, $V_{CBOOT,\ top}$, $V_{TDRIVING}$, respectively) during a driving operation. In the simulation, the supply voltage has been set at about 1.3 V, and the input signal VIN has been assumed to have a constant value substantially equal to half-swing (i.e. about 0.7 V).

Figure 4A:
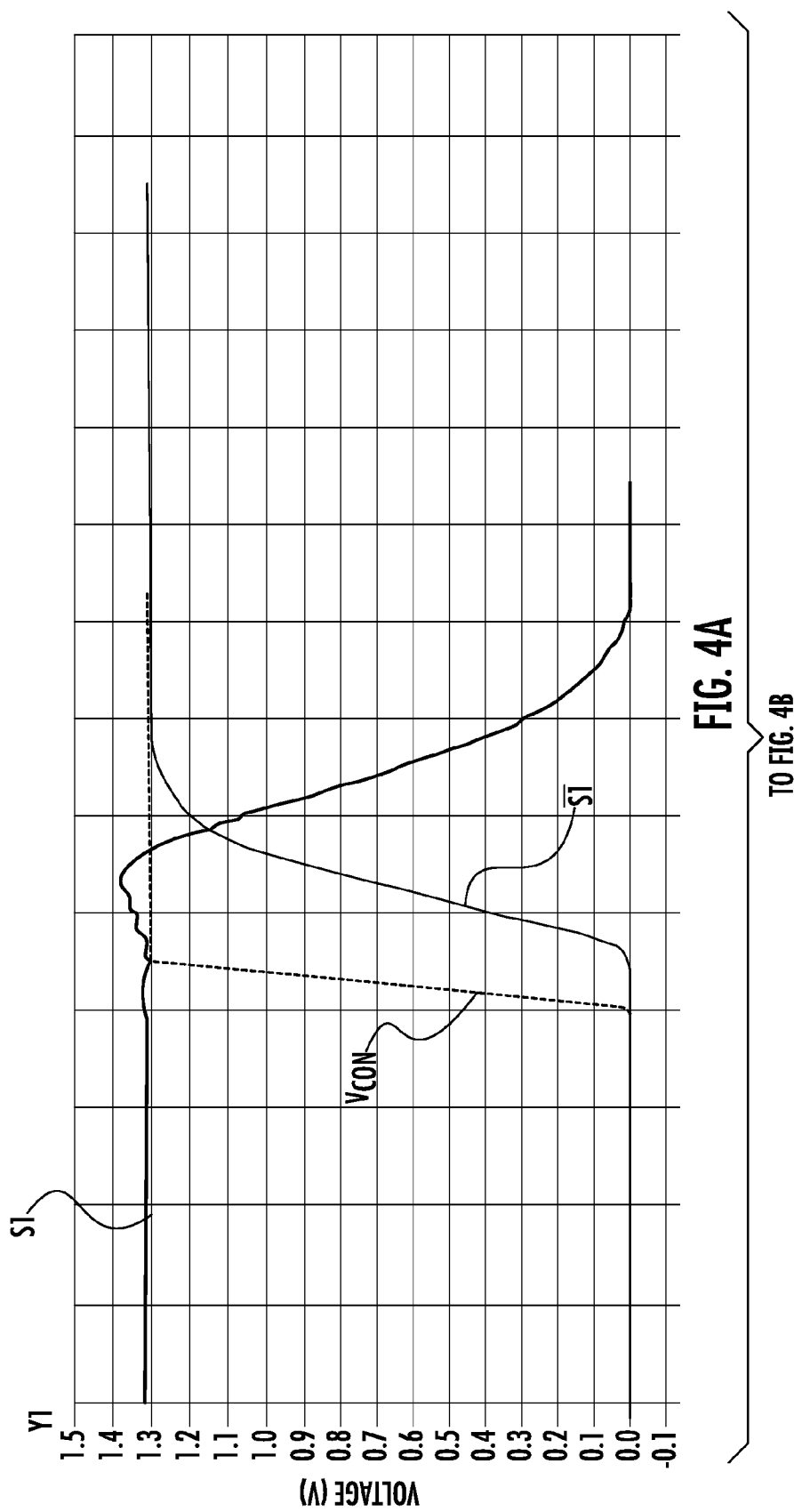
FIGS. 4A-4C are diagrams of a circuit simulation of some exemplary signals of the switch of FIG. 3.
Figure 4B:
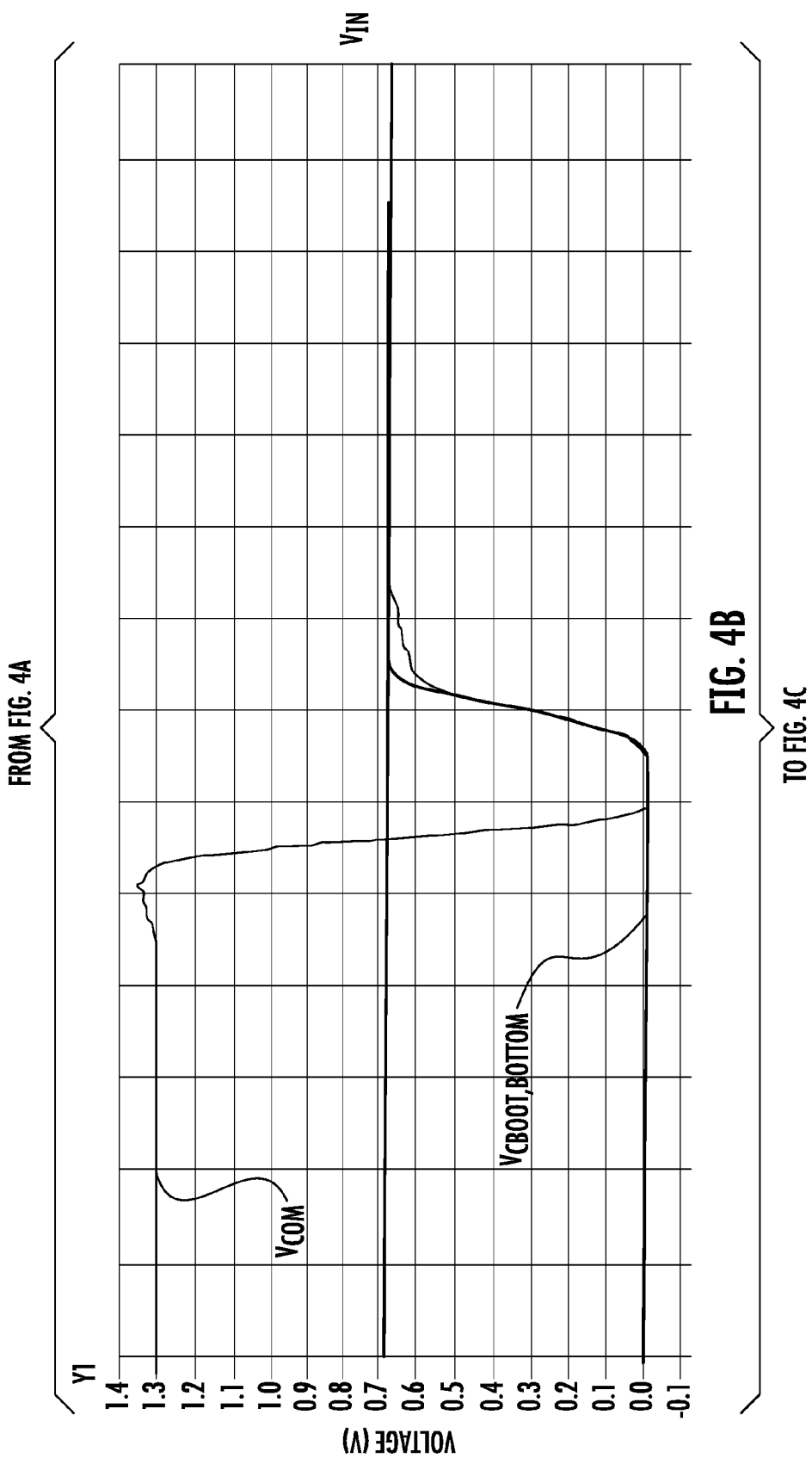
Figure 4C:
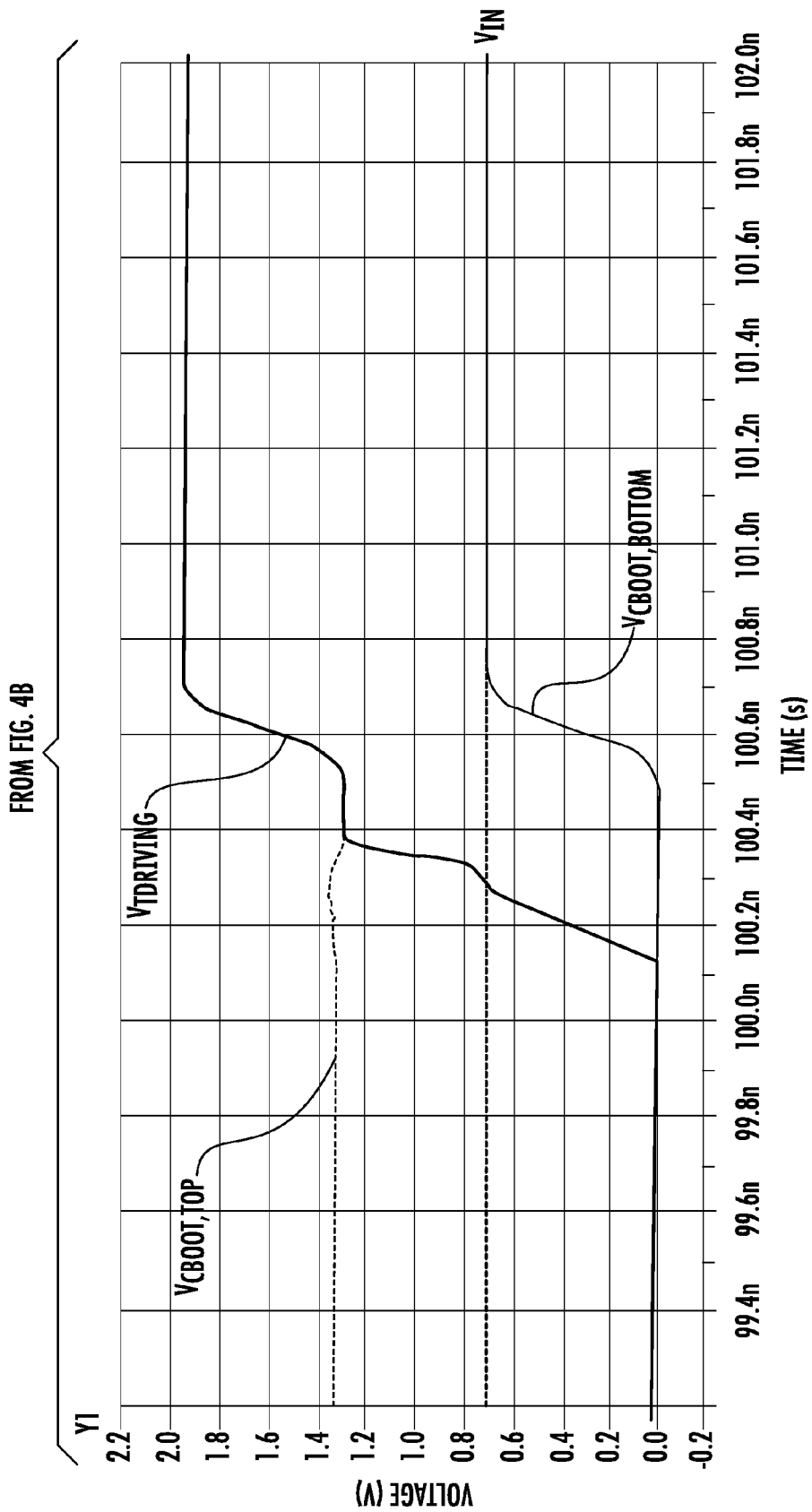

The operation of the switch 200 according to the described embodiment can be summarized as follows (with reference to FIG. 3 jointly with FIGS. 4A-4C). Starting from an initial condition, where the control signal VCON is not asserted, the signal S1 is asserted (transistor 215 turned-on), so that the bottom plate $C_{BOOT,\ bottom}$ is initialized to the ground voltage. Similarly, the signal $\overline{S1}$ is de-asserted (transistor 2353 turned-on), whereby the terminal TDRIVING is initialized to the ground voltage as well (transistor 105 turned-off, i.e. switch 200 opened). In such condition, the transistor 2352 is turned-on (thereby imposing the supply voltage VDD to the top plate $C_{BOOT,\ top}$, and hence across the capacitor $C_{BOOT}$), whereas the transistor 2351 is turned-off (as, being the signal $\overline{S1}$ de-asserted, the transistor 2401 is turned-on, whereby the command signal VCOM is equal to the supply voltage VDD).

Furthermore, in such condition, the drain terminals of the transistors 2251, 2252 are at a voltage value equal to VIN and VIN−VDD, respectively (with the capacitors CIN1, CIN2 that have the same voltage drop equal to VIN−VDD across their terminals), so that the transistor 2253 is turned-off (thereby preventing the transfer of the input signal VIN to the bottom plate $C_{BOOT, bottom}$.

At the start of the driving operation (control signal VCON being asserted, time instant t0=100 ns), the signal S1 is de-asserted (transistor 215 turned-off), and the signal $\overline{S1}$ is asserted. This causes the turn-on of the transistor 2353, whereby the terminal TDRIVING, between the time instants t1=100.1 ns and t2=100.3 ns, is brought to the voltage $$VTDRIVING=VDD-Vth;$$

wherein Vth indicates the threshold voltage of the transistor 2353. In this way, the subsequent transfer of the driving signal VDRIVING to the terminal TDRIVING (i.e. VTDRIVING=VDRIVING) will be sped-up.

At (time instant t2), the assertion of the control signal VCON (and therefore of the signal S1) causes the turning-on of the transistor 2402, which forces the command signal VCOM to the ground voltage (t3=100.4 ns)—the transistors 2401 and 2402 implement a logic inverter. This causes the turning-on of the transistor 2351 (as there is a voltage drop equal to the supply voltage VDD between the gate and source terminals thereof). As a consequence, between the time instants t2=100.3 ns and t3=100.4 ns, the terminal TDRIVING is brought to the supply voltage VDD (which will further speed-up the subsequent transfer of the driving signal VDRIVING to the terminal TDRIVING).

The assertion of the control signal VCON causes the capacitor CIN1, CIN2 to experience a voltage decrease/increase equal to the supply voltage VDD at its bottom plate. As a consequence, after a predetermined time (depending, for example, from sizing of its components), at the instant t4=100.5 ns the drain terminals of the transistors 2251, 2252 take, respectively, a voltage value equal to VDD−VIN and VIN (as the capacitors CIN1 and CIN2 tend to maintain the same voltage drop equal to VDD−VIN across their terminals), so that the transistor 2253 turns-on (thereby allowing the transfer, between the time instants t4=100.5 ns and t5=100.7 ns of the input signal VIN to the bottom plate $C_{BOOT, bottom}$).

In response to that, the top plate $C_{BOOT, top}$ will be brought to a voltage value equal to VIN+VDD (as the bootstrap capacitor $C_{BOOT}$ tends to maintain at its terminals to the same voltage drop, equal to the supply voltage VDD), which represents the driving signal VDRIVING to be transferred to the terminal TDRIVING through the transistor 2351. Meanwhile, the command signal VCOM takes the value of the input signal VIN (transistor 2402 being turned-on), i.e. the command signal VCOM is brought to the voltage of the bottom plate $C_{BOOT, bottom}$, which keeps the transistor 2351 turned-on (so as to transfer the driving signal VDRIVING to the terminal TDRIVING) without advance turn-off (as between the gate terminal, at the same voltage of the input signal VIN, and the source terminal of the transistor 2351, at the voltage of the driving signal VDRIVING=VIN+VDD there is a voltage drop equal to the supply voltage VDD), and without excessive voltage drops between the gate terminal and the drain terminal of the transistor 2351.

As may be verified, the other transistors of the switch 200 are never affected by overvoltages across their terminals. This makes the described implementation particularly advantageous as it allows making the switch 200 by low-voltage transistors instead of high-voltage transistors (i.e. able to withstand high voltage drops between the gate terminal and the drain terminal without incurring breaks, such as the breaking of the oxide layer, or malfunctions). The possibility of making the switch 200 completely by low-voltage transistors involves less area occupation (as they are smaller than the high-voltage transistors), better performance (as, having small size, they introduce low parasitic capacitances, thus allowing to obtain high switching frequencies), and low electric power consumption (no use of charge pumps for generating the overvoltages).

The disclosed approach is advantageous as it may require short execution times (of the order of nanoseconds), substantially determined by the delay between the assertion of the control signal VCON and settlement of the driving signal VDRIVING at the value VIN+VDD). Therefore, the disclosed approach acts as a level shifter that is comparable, in terms of speed, with a conventional logic gate.

Naturally, in order to satisfy local and specific requirements, a skilled person may apply to the approach described above many logical and/or physical modifications and alterations. More specifically, although this approach has been described with a certain degree of particularity with reference to one or more embodiments thereof, it should be understood that various omissions, substitutions and changes in the form and details as well as other embodiments are possible.

Particularly, different embodiments of the embodiments may even be practiced without the specific details (such as the numerical examples) set forth in the preceding description to provide a more thorough understanding thereof. Conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

Similar considerations apply if the electronic switch has a different structure or comprises equivalent components. In any case, any of its components can be separated into several elements, or two or more components can be combined into a single element. In addition, each component can be replicated to support the execution of the corresponding operations in parallel. It should also be noted that (unless stated otherwise), any interaction between different components generally need not to be continuous, and can be direct or indirect via one or more intermediaries.

Moreover, although in the exemplary described embodiment reference has been made to a driving circuit having PMOS and NMOS transistors in such a configuration to ensure the proper operation of the electronic switch, nothing prevents from implementing further embodiments, for example, dual configurations. It should be readily understood that the proposed structure may be part of the design of an integrated circuit. The design may also be created in a programming language; moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems (such as automotive applications or microcontrollers). In addition, the approach according to an embodiment lends itself to be implemented through an equivalent method (by using similar steps, removing some non-essential steps, or adding additional optional steps); moreover, the steps can be performed in a different order, in parallel or overlapped (at least in part).

That which is claimed is:

1. An electronic switch comprising:
a transfer transistor having a first conduction terminal configured to receive an input signal, a second conduction terminal, and a control terminal;
said transfer transistor configured to enable/disable a transfer of the input signal from said first conduction terminal to said second conduction terminal according to a control signal, the control signal having either a first value or a second value different from the first value, a difference between the first value and the second value defining, in absolute value, an operative value of the control signal; and
a driving circuit comprising
a capacitor comprising a first terminal, and a second terminal,
an input circuit comprising
an input transistor having a first conduction terminal configured to receive the input signal, a second conduction terminal coupled to the first terminal of said capacitor, and a control terminal, and
a first latch circuit configured to receive the input signal and provide a corresponding shifted latched input signal to the control terminal of said input transistor, the shifted latched input signal being equal to a difference between the input signal and the operative value of the control signal, and
an output circuit configured to provide the driving signal to the control terminal of said transfer transistor, the driving signal being equal to a sum of the input signal and the operative value of the control signal.

2. The electronic switch according to claim 1 wherein the control signal is de-asserted at the first value and asserted at the second value greater than the first value; wherein said input transistor is configured to provide, upon assertion of the control signal, the input signal to said capacitor, said capacitor configured to generate the driving signal upon reception of the input signal; and wherein said driving circuit comprises an initialization module configured to charge, upon de-assertion of the control signal, said capacitor to the operative value of the control signal.

3. The electronic switch according to claim 2 wherein said initialization module is configured to initialize the first terminal of said capacitor to the first value
and wherein said input circuit is configured to provide the input signal to the first terminal of said capacitor, the second terminal of said capacitor configured to generate the driving signal upon reception of the input signal at the first terminal.

4. The electronic switch according to claim 3 wherein said transfer transistor has a first type of conductivity; wherein said initialization module comprises a second latch circuit configured to receive the control signal and provide a corresponding latched control signal and a negative latched control signal.

5. The electronic switch according to claim 2 wherein said output circuit comprises:
a first output transistor of the second type of conductivity having a first conduction terminal coupled to the second terminal of said capacitor, a second conduction terminal, and a control terminal; and an inverter circuit having a first reference terminal configured to receive the second value, and a second reference terminal coupled to the first terminal of said capacitor, said inverter circuit configured to receive the negative latched control signal and provide a command signal to the control terminal of said first output transistor, the command signal being equal to a current value at the first terminal of said capacitor when the negative latched control signal is asserted.

6. The electronic switch according to claim 5 further comprising a protection circuit coupled to the first conduction terminal of said input transistor and configured to protect said first latch circuit from an overvoltage, said protection circuit comprising at least two protection transistors of the second type of conductivity in diode-connected configuration connected in series.

7. The electronic switch according to claim 6 further comprising a second output transistor having a first conduction terminal coupled to the control terminal of said transfer transistor, a second conduction terminal configured to receive the negative latched control signal, and a control terminal configured to receive the second value, said second output transistor configured to initialize the control terminal of the transfer transistor to the first value and to the second value according to the de-assertion and assertion, respectively, of the negative latched control signal.

8. An integrated circuit (IC) comprising:
a substrate; and
a plurality of electronic switches on said substrate, each electronic switch comprising
a transfer transistor having a first conduction terminal configured to receive an input signal, a second conduction terminal, and a control terminal,
said transfer transistor configured to enable/disable a transfer of the input signal from said first conduction terminal to said second conduction terminal, and
a driving circuit comprising
a capacitor comprising a first terminal, and a second terminal,
an input circuit comprising
an input transistor having a first conduction terminal configured to receive the input signal, a second conduction terminal coupled to the first terminal of said capacitor, and a control terminal, and
a first latch circuit configured to receive the input signal and provide a corresponding shifted latched input signal to the control terminal of said input transistor, the shifted latched input signal being equal to a difference between the input signal and the operative value of the control signal, and
an output circuit configured to provide the driving signal to the control terminal of said transfer transistor, the driving signal being equal to a sum of the input signal and the operative value of the control signal.

9. The IC according to claim 8 wherein the control signal has either a first value or a second value different from the first value, a difference between the first value and the second value defining the operative value of the control signal.

10. The IC according to claim 9 wherein the control signal is de-asserted at the first value and asserted at the second value greater than the first value; wherein said input transistor is configured to provide, upon assertion of the control signal, the input signal to said capacitor, said capacitor configured to generate the driving signal upon reception of the input signal; and wherein said driving circuit comprises
    an initialization module configured to charge, upon de-assertion of the control signal, said capacitor to the operative value of the control signal.

11. The IC according to claim 10 wherein said initialization module is configured to initialize the first terminal of said capacitor to the first value
    and wherein said input circuit is configured to provide the input signal to the first terminal of said capacitor, the second terminal of said capacitor configured to generate the driving signal upon reception of the input signal at the first terminal.

12. The IC according to claim 11 wherein said transfer transistor has a first type of conductivity; wherein said initialization module comprises a second latch circuit configured to receive the control signal and provide a corresponding latched control signal and a negative latched control signal.

13. A method of making an electronic switch comprising:
providing a transfer transistor having a first conduction terminal to receive an input signal, a second conduction terminal, and a control terminal;
coupling the transfer transistor to enable/disable a transfer of the input signal from the first conduction terminal to the second conduction terminal according to a control signal, the control signal having either a first value or a second value different from the first value, a difference between the first value and the second value defining, in absolute value, an operative value of the control signal; and
coupling a driving circuit, the coupling of the driving circuit comprising
    coupling an input transistor having a first conduction terminal to receive the input signal, a second conduction terminal coupled to a first terminal of a capacitor, and a control terminal,
    coupling a first latch circuit to receive the input signal and provide a corresponding shifted latched input signal to the control terminal of the input transistor, the shifted latched input signal being equal to a difference between the input signal and the operative value of the control signal, and
    coupling an output circuit to provide the driving signal to the control terminal of the transfer transistor, the driving signal being equal to a sum of the input signal and the operative value of the control signal.

14. The method according to claim 13 wherein the control signal is de-asserted at the first value and asserted at the second value greater than the first value; wherein the input transistor is configured to provide, upon assertion of the control signal, the input signal to the capacitor, the capacitor configured to generate the driving signal upon reception of the input signal; and further comprising making the driving circuit by at least coupling an initialization module to charge, upon de-assertion of the control signal, the capacitor to the operative value of the control signal.

15. The method according to claim 14 further comprising making the initialization module by at least:
coupling the initialization module to initialize the first terminal of the capacitor to the first value; and
coupling the input circuit to provide the input signal to the first terminal of the capacitor, the second terminal of the capacitor generating the driving signal upon reception of the input signal at the first terminal.

16. A method for controlling an electronic switch comprising a transfer transistor having a first conduction terminal for receiving an input signal, a second conduction terminal, and a control terminal, the method comprising:
using a driving circuit for providing a driving signal equal to a sum of the input signal and an operative value of a control signal to the control terminal of the transfer transistor, the driving circuit comprising
    a capacitor comprising a first terminal, and a second terminal,
    an input circuit comprising
        an input transistor having a first conduction terminal to receive the input signal, a second conduction terminal coupled to the first terminal of the capacitor, and a control terminal, and
        a first latch circuit to receive the input signal and provide a corresponding shifted latched input signal to the control terminal of the input transistor, the shifted latched input signal being equal to a difference between the input signal and the operative value of the control signal, and
    an output circuit to provide the driving signal to the control terminal of the transfer transistor, the driving signal being equal to a sum of the input signal and the operative value of the control signal.

17. The method according to claim 16 further comprising using the transfer transistor to enable/disable a transfer of the input signal from the first conduction terminal to the second conduction terminal according to a control signal, the control signal having either a first value or a second value greater than the first value, a difference between the first value and the second value defining, in absolute value, an operative value of the control signal.

18. The method according to claim 17 wherein the control signal is de-asserted at the first value and asserted at the second value greater than the first value; and further comprising making the driving circuit by at least
coupling an initialization module to charge, upon de-assertion of the control signal, the capacitor to the operative value of the control signal.

19. The method according to claim 18 further comprising making the initialization module by at least:
coupling the initialization module to initialize the first terminal of the capacitor to the first value; and
coupling the input circuit to provide the input signal to the first terminal of the capacitor, the second terminal of the capacitor generating the driving signal upon reception of the input signal at the first terminal.

20. The method according to claim 19 wherein the transfer transistor has a first type of conductivity; wherein the initialization module comprises a second latch circuit configured to receive the control signal and provide a corresponding latched control signal and a negative latched control signal.

* * * * *